(12) United States Patent
Ryu et al.

(10) Patent No.: US 11,289,546 B2
(45) Date of Patent: Mar. 29, 2022

(54) TRANSPARENT DISPLAY DEVICE

(71) Applicant: LG Display Co., Ltd., Seoul (KR)

(72) Inventors: Jiho Ryu, Paju-si (KR); TaeHan Park, Paju-si (KR); Dongyoung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/712,505

(22) Filed: Dec. 12, 2019

(65) Prior Publication Data

US 2020/0212110 A1 Jul. 2, 2020

(30) Foreign Application Priority Data

Dec. 31, 2018 (KR) .................. 10-2018-0173462

(51) Int. Cl.
*H01L 27/32* (2006.01)
*H01L 51/52* (2006.01)

(52) U.S. Cl.
CPC ........ *H01L 27/322* (2013.01); *H01L 27/3211* (2013.01); *H01L 51/5215* (2013.01); *H01L 51/5234* (2013.01); *H01L 51/5284* (2013.01); *H01L 2251/305* (2013.01)

(58) Field of Classification Search
CPC ............... H01L 27/322; H01L 27/3211; H01L 51/5215; H01L 51/5234; H01L 51/5284
See application file for complete search history.

(56) References Cited

U.S. PATENT DOCUMENTS

| 10,283,572 B2 | 5/2019 | Lee et al. |
| 10,516,077 B2 | 12/2019 | Chung et al. |
| 11,018,158 B2 | 5/2021 | Chung et al. |
| 2012/0319564 A1* | 12/2012 | Ghosh .................... B82Y 20/00 313/500 |
| 2013/0193843 A1* | 8/2013 | Yan ..................... H01L 27/3267 313/504 |
| 2015/0076456 A1* | 3/2015 | Choi ................... H01L 27/3267 257/40 |

(Continued)

FOREIGN PATENT DOCUMENTS

| CN | 102916138 A | 2/2013 |
| CN | 104485427 A | 4/2015 |

(Continued)

OTHER PUBLICATIONS

China National Intellectual Property Administration, Office Action, CN Patent Application No. 201911222720.1, dated Jun. 28, 2021, 23 pages.

*Primary Examiner* — Christine A Enad
(74) *Attorney, Agent, or Firm* — Fenwick & West LLP

(57) ABSTRACT

A transparent display device for providing only a viewer located at the front with an image is disclosed. The transparent display device comprises a substrate provided with a first subpixel, a second subpixel and a third subpixel, a first electrode provided in each of the first subpixel, the second subpixel and the third subpixel on the substrate, a light emitting layer provided on the first electrode, a second electrode provided on the light emitting layer, an upper color filter provided over the second electrode, a lower color conversion layer provided between the substrate and the first electrode, and a lower color filter provided between the substrate and the lower color conversion layer.

19 Claims, 7 Drawing Sheets

(56) References Cited

U.S. PATENT DOCUMENTS

| | | | |
|---|---|---|---|
| 2016/0260791 A1* | 9/2016 | Fleissner | H01L 27/3216 |
| 2017/0162829 A1* | 6/2017 | Lai | H01L 51/5234 |
| 2017/0194382 A1 | 7/2017 | Lee et al. | |
| 2018/0351035 A1 | 12/2018 | Chung et al. | |
| 2019/0148458 A1* | 5/2019 | Kim | H01L 51/502 |
| | | | 257/89 |
| 2020/0075801 A1 | 3/2020 | Chung et al. | |

FOREIGN PATENT DOCUMENTS

| | | |
|---|---|---|
| CN | 106935716 A | 7/2017 |
| CN | 108987423 A | 12/2018 |
| KR | 10-2018-0036840 A | 4/2018 |

\* cited by examiner

TRANSPARENT DISPLAY DEVICE

CROSS-REFERENCE TO RELATED APPLICATIONS

This application claims the benefit of Republic of Korea Patent Application No. 10-2018-0173462 filed on Dec. 31, 2018, which is hereby incorporated by reference in their entirety.

BACKGROUND

Technical Field

The present disclosure relates to a transparent display device for displaying an image.

Description of the Related Art

With the advancement of the information age, a demand for a transparent display device for displaying an image has been increased in various forms. Therefore, various display devices such as liquid crystal display (LCD) devices, plasma display panel (PDP) devices, and organic light emitting display (OLED) devices have been used.

Recent, studies for transparent display devices for allowing a user to look at objects or background arranged on a rear surface of a display device are actively ongoing. The transparent display devices have advantages in space availability, interior, and design and may be applied to various fields. The transparent display devices may embody an information recognition function, an information processing function, and an information display function by using a transparent electronic device, thereby solving the spatial limitation and visual limitation of the existing electronic devices. For example, the transparent display devices may be applied to windows of buildings or vehicles and thus may be embodied as a smart window which allows the background to be seen or displays an image.

The transparent display device has a non-transmissive area and a transmissive area, and transmits light to the transmissive area. The transparent display device may display an image on the transmissive area. In this case, when a viewer located in front of the transparent display device views the image, a third party located behind the transparent display device may also view the image. At this time, problems may occur in that information may be released to the third party through the image displayed on the transparent display device and privacy is not ensured.

SUMMARY

The present disclosure has been made in view of the above problems, and it is an object of the present disclosure to provide a transparent display device for providing only a viewer located at the front with an image.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a transparent display device comprising a substrate provided with a first subpixel, a second subpixel and a third subpixel, a first electrode provided in each of the first subpixel, the second subpixel and the third subpixel on the substrate, a light emitting layer provided on the first electrode, a second electrode provided on the light emitting layer, an upper color filter provided on the second electrode, a lower color conversion layer provided between the substrate and the first electrode, and a lower color filter provided between the substrate and the lower color conversion layer.

According to the present disclosure, the lower conversion layer is provided between the substrate and the first electrode, whereby light emitted from the light emitting layer is shielded from progressing to the substrate. For this reason, the transparent display device according to the present invention cannot allow a viewer located behind the transparent display device to view an image.

Also, the present disclosure embodies a transparent display device that allows a viewer located in front of the transparent display device to view an object or a background arranged on a rear surface as well as an image which is displayed. The present invention allows a viewer located in front of the transparent display device to view an image displayed on a transparent display and at the same time allows a third party located behind the transparent display device not to view the image. Therefore, the present invention may prevent information from being released to the third party through the image displayed on the transparent display device and make sure of privacy.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
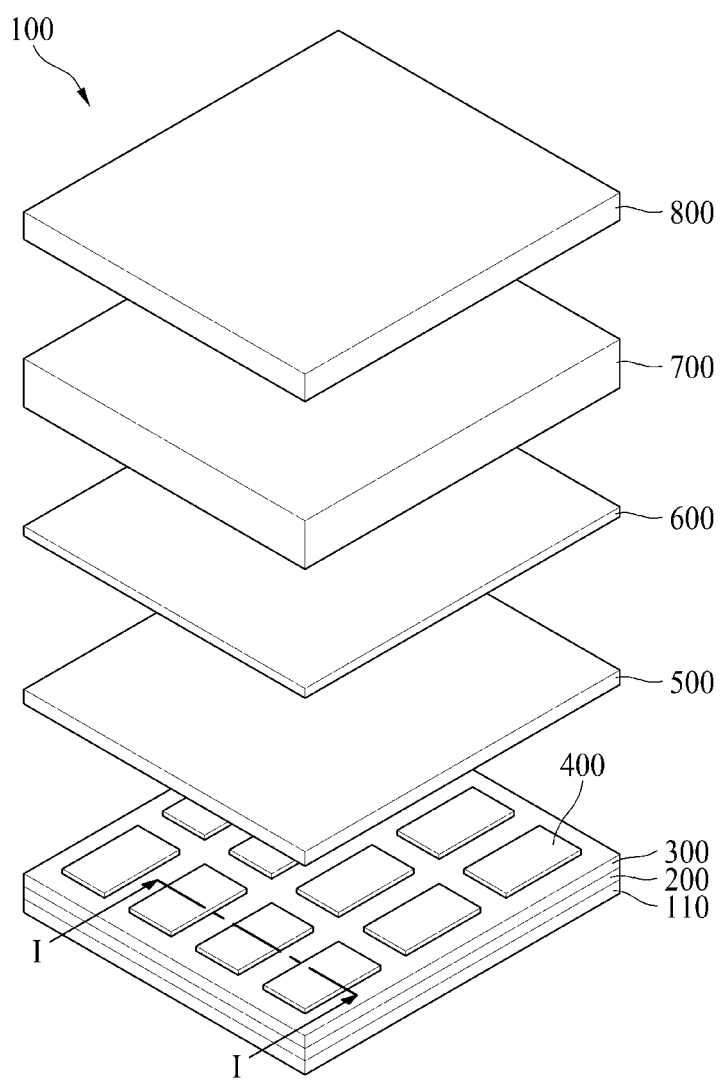
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

Figure 2:
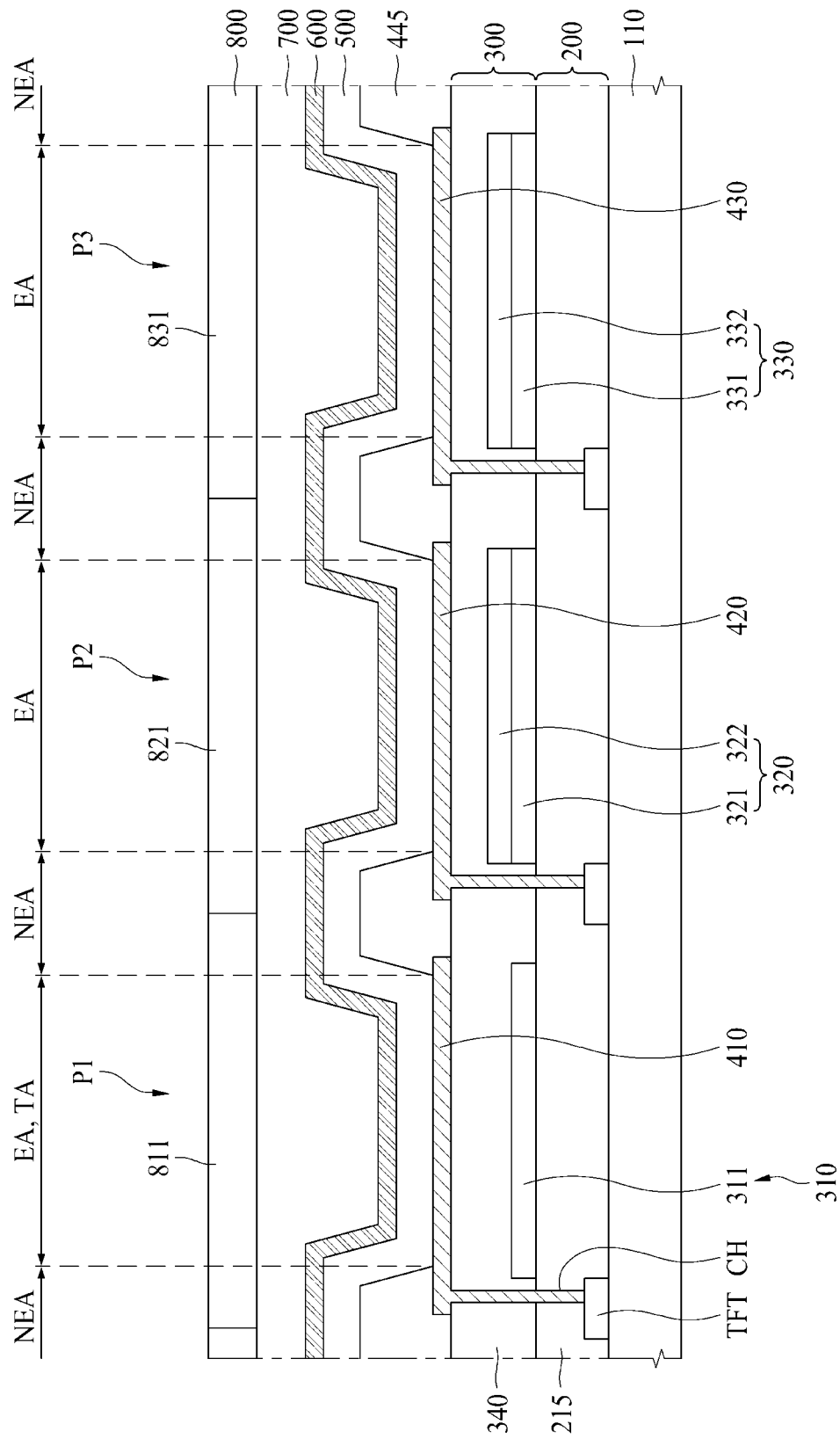
FIG. 2 is a cross-sectional view taken along line I-I' of FIG. 2 according to one embodiment of the present disclosure.
Figure 3:
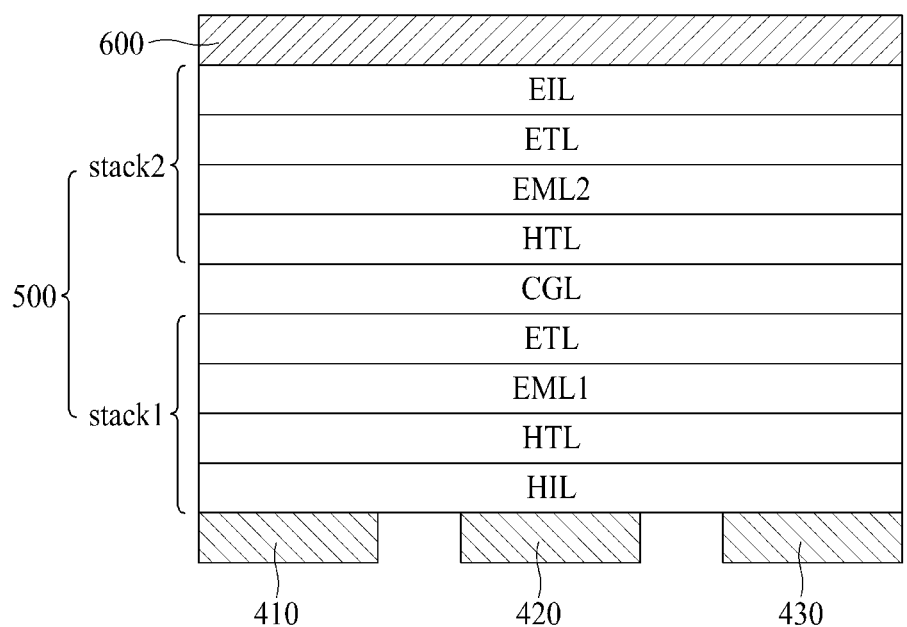
FIG. 3 is a cross-sectional view illustrating an example of a first electrode and a light emitting layer in a display device according to one embodiment of the present disclosure.
Figure 4:
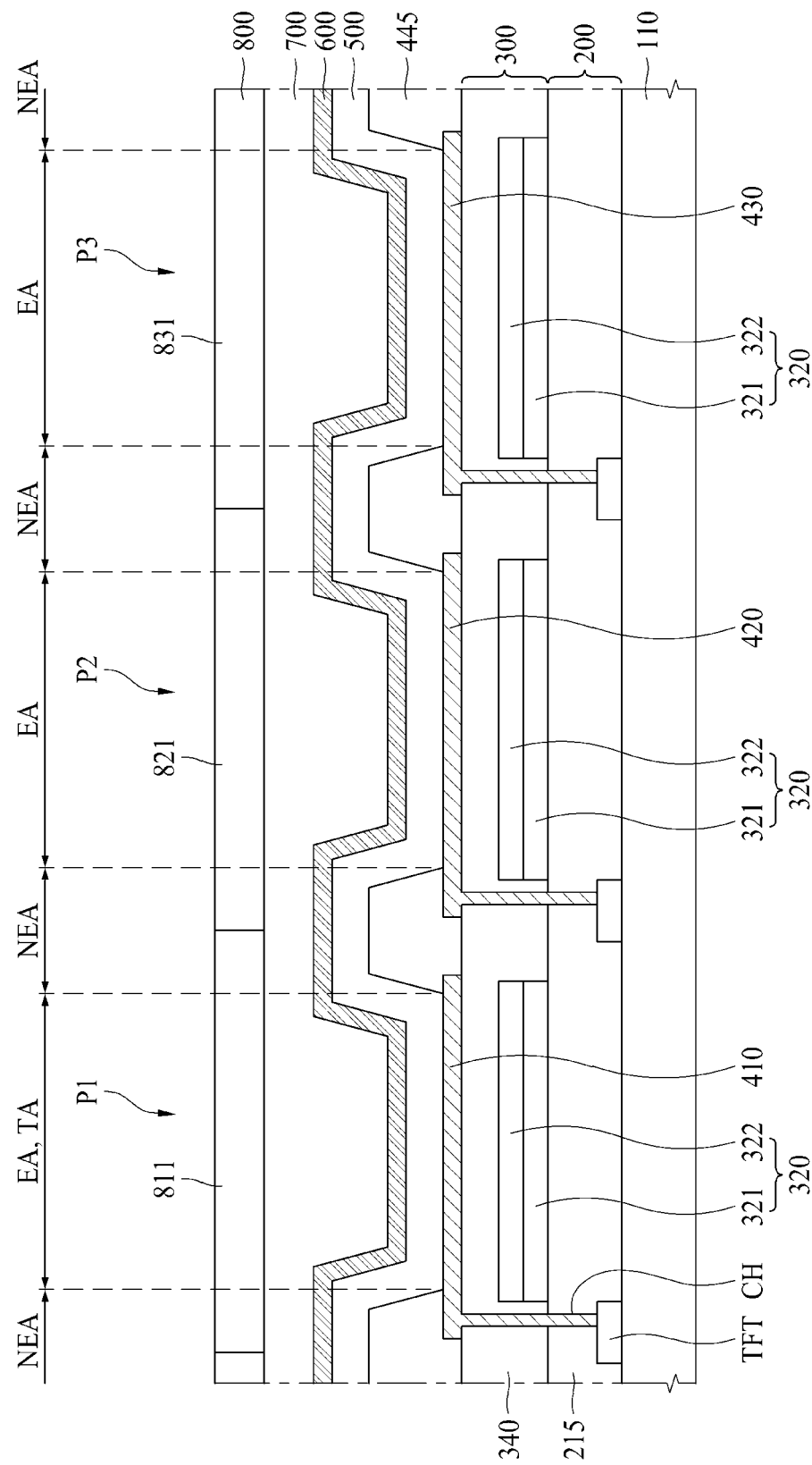
FIG. 4 is a cross-sectional view according to a modified embodiment of FIG. 2.
Figure 5:
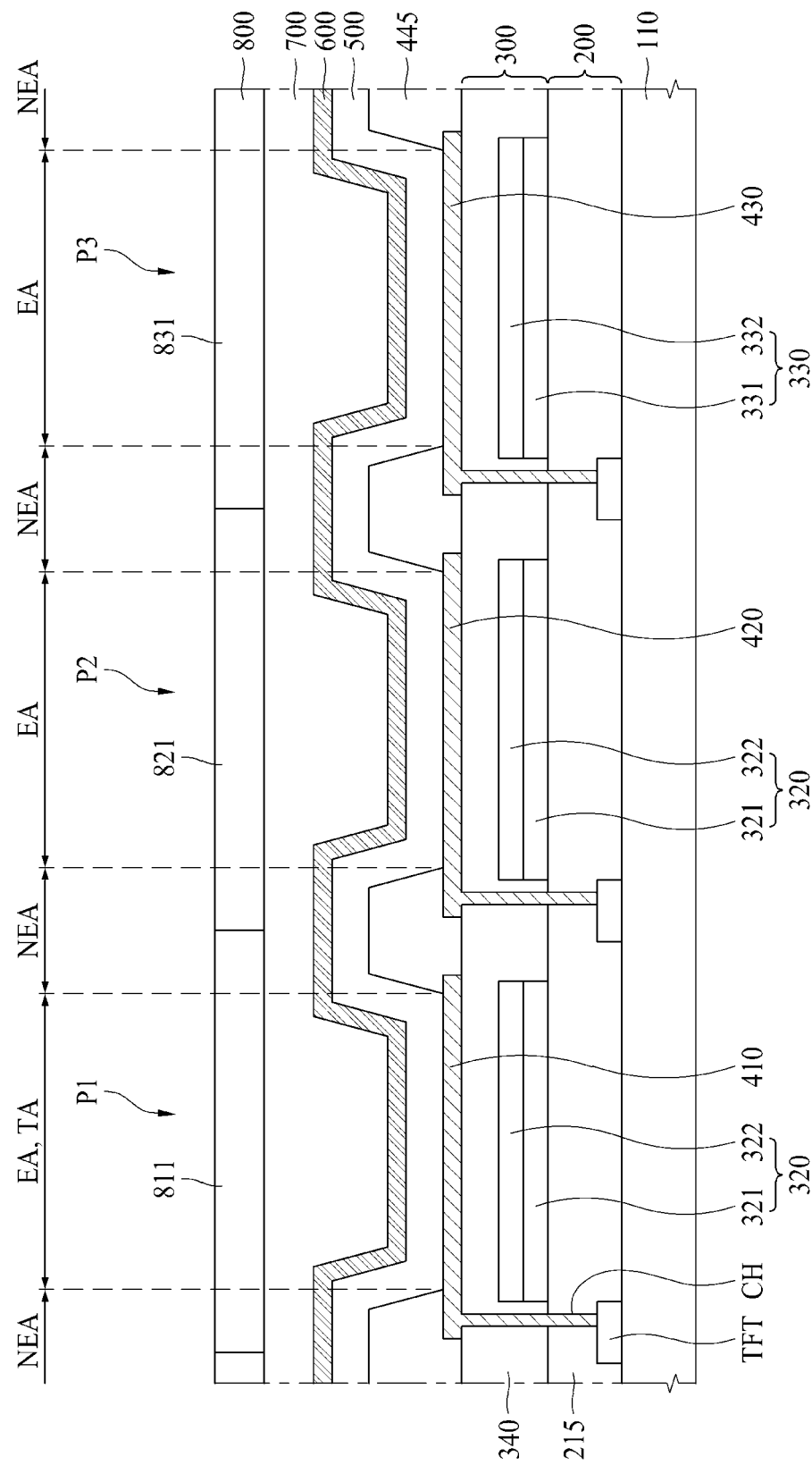
FIG. 5 is a cross-sectional view according to another modified embodiment of FIG. 2.
Figure 6:
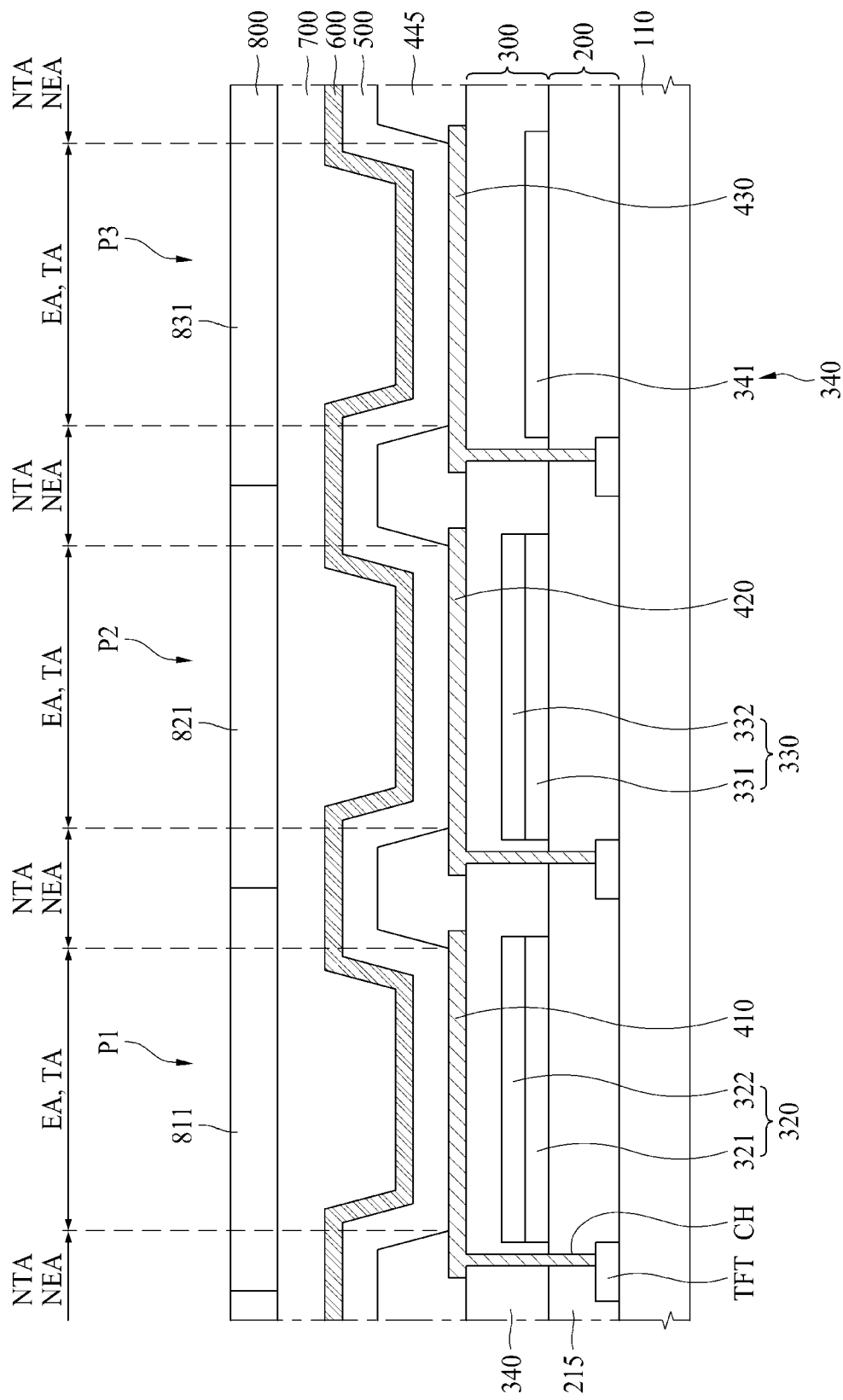
FIG. 6 is a cross-sectional view according to still another modified embodiment of FIG. 2.
Figure 7:
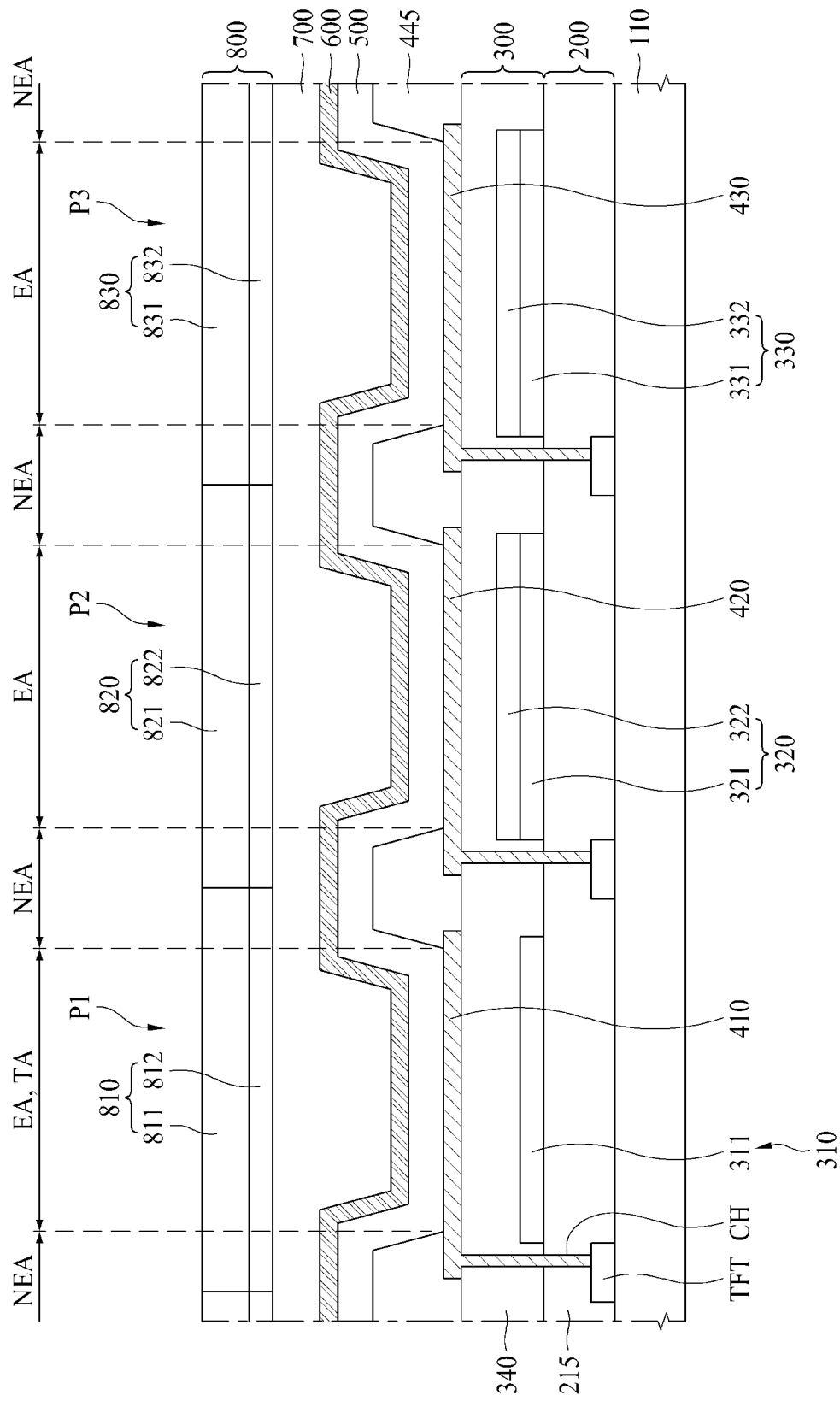
FIG. 7 is a cross-sectional view according to further still another modified embodiment of FIG. 2.

FIG. 1 is a perspective view illustrating a transparent display device according to one embodiment of the present disclosure, FIG. 2 is a cross-sectional view taken along line I-I' of FIG. 2, FIG. 3 is a cross-sectional view illustrating an example of a first electrode and a light emitting layer in a display device according to one embodiment of the present disclosure, FIG. 4 is a cross-sectional view according to a modified embodiment of FIG. 2, FIG. 5 is a cross-sectional view according to another modified embodiment of FIG. 2, and FIG. 6 is a cross-sectional view according to still another modified embodiment of FIG. 2. FIG. 7 is a cross-sectional view according to further still another modified embodiment of FIG. 2.

Referring to FIGS. 1 to 3, the transparent display device 100 according to one embodiment of the present disclosure comprises a substrate 110, a circuit element layer 200, a lower conversion layer 300, a first electrode 400, a bank 445, a light emitting layer 500, a second electrode 600, an encapsulation layer 700, and an upper conversion layer 800.

The substrate 110 may be made of, but not limited to, glass or plastic. The substrate 110 may be made of a semiconductor material such as silicon wafer. The substrate 110 may be made of a transparent material to transmit externally incident light.

A first subpixel P1, a second subpixel P2, and a third subpixel P3 are provided over the substrate 110. The first subpixel P1 may emit red light, the second subpixel P2 may emit green light, and the third subpixel P3 may emit blue light, but these subpixels are not limited to this example. For example, an arrangement sequence of the subpixel P1, P2 and P3 may be changed in various ways.

The circuit element layer 200 is provided over the substrate 110.

The circuit element layer 200 includes a circuit element comprising various types of signal lines, a transistor and a capacitor. The circuit element is provided for each of the subpixels P1, P2, and P3. The signal lines may include gate lines, data lines, power lines and reference lines, and the transistor may include a switching thin film transistor, a driving thin film transistor TFT, and a sensing transistor.

The switching thin film transistor is switched in accordance with a gate signal supplied to the gate line and serves to supply a data voltage supplied from the data line to the driving thin film transistor TFT.

The driving thin film transistor TFT is switched in accordance with the data voltage supplied from the switching thin film transistor to generate a data current from a power source supplied from the power line and serves to supply the generated data current to the first electrodes 410, 420 and 430.

The sensing transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor TFT for one frame and is connected to each of a gate terminal and a source terminal of the driving thin film transistor TFT.

An inter-layer dielectric film 215 is provided over the various signal lines, the transistor and the capacitor to planarize an upper surface.

The inter-layer dielectric film 215 may be formed of, but not limited to, an inorganic film, for example, a silicon oxide (SiOx) film, a silicon nitride (SiNx) film, or a multi-layered film of the SiOx film and the SiNx film. The inter-layer dielectric film 215 may be formed of an organic film, for example, acryl resin, epoxy resin, phenolic resin, polyamide resin, polyimide resin, etc. Alternatively, the inter-layer dielectric film 215 may be formed of a multi-layered film of at least one inorganic film and at least one organic film.

The lower conversion layer 300 is provided over the circuit element layer 200, and shields light emitted from the light emitting layer 500 from progressing to the substrate 110. To this end, the lower conversion layer 300 includes a first lower conversion layer 310 made of a first lower color filter 311, a second lower conversion layer 320 made of a second lower color conversion layer 322 and a second lower color filter 321, and a third lower conversion layer 330 made of a third lower color conversion layer 332 and a third lower color filter 331.

The first lower conversion layer 310 is formed to be patterned on a position corresponding to the first subpixel P1. Particularly, the first lower conversion layer 310 may be arranged on a light emitting area EA of the first subpixel P1.

The first lower color filter 311 transmits light of a red wavelength range, and absorbs light of the other wavelength ranges, for example, light of a blue wavelength range and light of a green wavelength range. The first lower color filter 311 may include a red dye.

In the first subpixel P1, light emitted from the light emitting layer 500 may progress to a lower portion on which the substrate 110 is arranged. The light progressing to the lower portion is partially shielded from progressing to the substrate 110 due to the first lower conversion layer 310.

In detail, the first lower color filter 311 transmits light of a red wavelength range from the light emitted from the light emitting layer 500, and absorbs light of the other wavelength ranges, for example, light of a blue wavelength range and light of a green wavelength range. As a result, only the light of the red wavelength range from the light emitted from the light emitting layer 500, progressing to the substrate 110 may pass through the substrate 110.

Meanwhile, the first lower color filter 311 transmits light of a red wavelength range from external light entering toward the substrate 110, and absorbs light of the other wavelength ranges, for example, light of a blue wavelength range and light of a green wavelength range. Therefore, only the light of the red wavelength range from the external light may enter the first upper color filter 811.

The second lower conversion layer 320 is formed to be patterned on a position corresponding to the second subpixel P2. Particularly, the second lower conversion layer 320 may be arranged on a light emitting area EA of the second subpixel P2.

The second lower color conversion layer 322 may be a downward conversion layer. The downward conversion layer may emit light having low energy by absorbing light having high energy. The second lower color conversion layer 322 absorbs light of a yellow wavelength range or light of a green wavelength range and converts the corresponding light to light of a red wavelength range. The second lower color conversion layer 322 may include red quantum dot particles.

The second lower color filter 321 transmits light of a green wavelength range, and absorbs light of the other wavelength ranges, for example, light of a blue wavelength range and light of a red wavelength range. The second lower color filter 321 may include a green dye.

In the second subpixel P2, light emitted from the light emitting layer 500 may progress to the lower portion on which the substrate 110 is arranged. The light progressing to the lower portion is shielded from progressing to the substrate 110 due to the second lower conversion layer 320.

In detail, the second lower color conversion layer 322 absorbs light of a yellow wavelength range or light of a green wavelength range from the light emitted from the light emitting layer 500 and converts the corresponding light to light of the red wavelength range. Therefore, the light of the blue wavelength range and the light of the red wavelength range remain as the light which has passed through the second lower color conversion layer 322. At this time, since the light of the green wavelength range is absorbed by the second lower color conversion layer 322, the light of the green wavelength range fails to pass through the second lower color conversion layer 322.

The second lower color filter 321 transmits the light of the green wavelength range from the incident light from the second lower color conversion layer 322, and absorbs light of the other wavelength ranges, for example, light of the blue wavelength range and light of the red wavelength range. Since the light of the blue wavelength range and the light of the red wavelength range only pass through the second lower color conversion layer 322, the second lower color filter 321 fully absorbs the incident light from the second lower color conversion layer 322.

As a result, the light emitted from the light emitting layer 500, progressing to the substrate 110 is fully absorbed by the second lower conversion layer 320.

Meanwhile, the second lower conversion layer 320 partially transmits external light entering toward the substrate 110. In detail, the second lower color filter 321 transmits light of the green wavelength range from the external light entering toward the substrate 110, and absorbs light of the other wavelength ranges, for example, light of the blue wavelength range and light of the red wavelength range. The second lower color conversion layer 322 absorbs light of the green wavelength range from the second lower color filter 321 and converts the corresponding light to light of the red wavelength range. The second lower conversion layer 320 may transmit only the light of the red wavelength range from the external light entering toward the substrate 110. Therefore, only the light of the red wavelength range from the external light may enter the second upper color filter 821.

The third lower conversion layer 330 is formed to be patterned on a position corresponding to the third subpixel P3. Particularly, the third lower conversion layer 330 may be arranged on a light emitting area EA of the third subpixel P3.

The third lower color conversion layer 332 may be a downward conversion layer. The downward conversion layer may emit light having low energy by absorbing light having high energy. The third lower color conversion layer 332 absorbs light of a blue wavelength range and converts the corresponding light to light of a green wavelength range. The third lower color conversion layer 332 may include green quantum dot particles.

The third lower color filter 331 transmits light of a blue wavelength range, and absorbs light of the other wavelength ranges, for example, light of a green wavelength range and light of a red wavelength range. The third lower color filter 331 may include a blue dye.

In the third subpixel P3, light emitted from the light emitting layer 500 may progress to the lower portion on which the substrate 110 is arranged. The light progressing to the lower portion is shielded from progressing to the substrate 110 due to the third lower conversion layer 330.

In detail, the third lower color conversion layer 332 absorbs light of a blue wavelength range from the light emitted from the light emitting layer 500 and converts the corresponding light to light of a green wavelength range. Therefore, the light of the green wavelength range and the light of the red wavelength range remain as the light which has passed through the third lower color conversion layer 332. At this time, since the light of the blue wavelength range is absorbed by the third lower color conversion layer 332, the light of the blue wavelength range fails to pass through the third lower color conversion layer 332.

The third lower color filter 331 transmits the light of the blue wavelength range from the incident light from the third lower color conversion layer 332, and absorbs light of the other wavelength ranges, for example, light of the green wavelength range and light of the red wavelength range. Since the light of the green wavelength range and the light of the red wavelength range only pass through the third lower color conversion layer 332, the third lower color filter 331 fully absorbs the incident light from the third lower color conversion layer 332.

As a result, the light emitted from the light emitting layer 500, progressing to the substrate 110 is fully absorbed by the third lower conversion layer 330.

Meanwhile, the third lower conversion layer 330 partially transmits external light entering toward the substrate 110. In detail, the third lower color filter 331 transmits light of the blue wavelength range from the external light entering toward the substrate 110, and absorbs light of the other wavelength ranges, for example, light of the green wavelength range and light of the red wavelength range. The third lower color conversion layer 332 absorbs light of the blue wavelength range from the third lower color filter 331 and converts the corresponding light to light of the green wavelength range. The third lower conversion layer 330 may transmit only the light of the green wavelength range from the external light entering toward the substrate 110. Therefore, only the light of the green wavelength range from the external light may enter a third upper color filter 831.

In the transparent display device 100 according to one embodiment of the present disclosure, the light emitted from the second subpixel P2 and the light emitted from the third subpixel P3 fail to pass through the substrate 110. Also, in the transparent display device 100 according to one embodiment of the present disclosure, the light emitted from the first subpixel P1 fails to partially pass through the substrate 110. Therefore, in the transparent display device 100 according to one embodiment of the present disclosure, a viewer cannot view a complete image at the rear of the transparent display device.

A planarization film 340 is provided over the first lower conversion layer 310, the second lower conversion layer 320, and the third lower conversion layer 330 to planarize the first lower conversion layer 310, the second lower conversion layer 320, and the third lower conversion layer 330.

The planarization film 340 may be formed of, but not limited to, an inorganic film, for example, a silicon oxide (SiOx) film, a silicon nitride (SiNx) film, or a multi-layered film of the SiOx film and the SiNx film. The planarization film 340 may be formed of an organic film, for example, acryl resin, epoxy resin, phenolic resin, polyamide resin, polyimide resin, etc. Alternatively, the planarization film 340 may be formed of a multi-layered film of at least one inorganic film and at least one organic film.

A contact hole CH is provided in the circuit element layer 200 and the lower conversion layer 300 for each of the subpixels P1, P2, and P3, whereby a source terminal or a drain terminal of the driving thin film transistor TFT is exposed through the contact hole CH. The contact hole CH may be provided in a non-light emitting area NEA overlapped with the bank 445.

The first electrode 400 is formed to be patterned on the lower conversion layer 300 for each of the subpixels P1, P2 and P3. One first electrode 410 is provided in the first subpixel P1, another first electrode 420 is provided in the second subpixel P2, and another first electrode 430 is provided in the third subpixel P3.

The first electrodes 410, 420, and 430 are each connected with a corresponding driving thin film transistor TFT provided in the circuit element layer 200. In detail, the first electrodes 410, 420 and 430 are each connected with the source terminal or the drain terminal of a corresponding driving thin film transistor TFT through the contact hole CH provided in the circuit element layer 200.

The first electrodes 410, 420, and 430 may be formed of a transparent conductive material (TCO) such as ITO and IZO, which can transmit light. The first electrodes 410, 420 and 430 may be anode electrodes.

The bank 445 is provided over the circuit element layer 200 to overlay a part of edges of the first electrodes 410, 420, and 430, whereby light emitting efficiency may be prevented from being deteriorated due to a current concentrated on the ends of the first electrodes 410, 420, and 430.

The bank 445 is provided among the subpixels P1, P2, and P3 in a matrix arrangement and defines a light emitting area EA in each of the first, second, and third subpixels P1, P2, and P3. That is, an opening area where the bank 445 is not provided in each of the subpixels P1, P2, and P3 becomes a light emitting area EA. On the other hand, an area where the bank 445 is provided in each of the subpixels P1, P2 and P3 is a non-light emitting area NEA.

The bank 445 may be made of a relatively thin inorganic insulating film or a relatively thick organic insulating film. Also, the bank 445 may include a material that can absorb light, for example, a black dye. That is, the bank 445 may be a black bank. The bank 445 may absorb light progressing to adjacent subpixels P1, P2, and P3, among the light emitted from the light emitting layer 500. Therefore, color mixture may be prevented from being generated among the adjacent subpixels P1, P2, and P3.

If the bank 445 is a black bank, the bank 445 may define a transmissive area TA in each of the plurality of subpixels P1, P2 and P3. That is, the exposed area of the first electrodes 410, 420, and 430, in which the bank 445 is not provided in each of the subpixels P1, P2, and P3, may be a transmissive area TA, and the area where the bank 445 is provided may be a non-transmissive area NTA (e.g., a non-emission area NEA).

The light emitting layer 500 is provided over the first electrodes 410, 420, and 430. The light emitting layer 500 may be provided over the bank 445. That is, the light emitting layer 500 is also provided in each of the subpixels P1, P2 and P3 and a boundary area among the subpixels P1, P2 and P3.

The light emitting layer 500 may be a white light emitting layer. In this case, the light emitting layer 500 may be a common layer commonly provided in the subpixels P1, P2 and P3.

The light emitting layer 500, as shown in FIG. 3, includes a first stack stack1 for emitting light of a first color, a second stack stack2 for emitting light of a second color, and a charge generating layer CGL provided between the first stack and the second stack.

The first stack stack1 is provided over the first electrodes 410, 420 and 430. The first stack stack1 may be formed of, but not limited to, a deposited structure of a hole injecting layer HIL, a hole transporting layer HTL, a first light emitting layer EML1 for emitting light of a first color, and an electron transporting layer ETL, which are deposited in due order.

The first light emitting layer EML1 may be at least one, but not limited to, a red light emitting layer for emitting red light, a green light emitting layer for emitting green light, a blue light emitting layer for emitting blue light, or a yellow light emitting layer for emitting yellow light.

The second stack stack2 is provided over the charge generating layer CGL. The second stack stack2 may be formed of, but not limited to, a deposited structure of a hole transporting layer HTL, a second light emitting layer EML2 for emitting light of a second color, an electron transporting layer ETL, and an electron injecting layer EIL, which are deposited in due order. The second light emitting layer EML2 may be at least one, but not limited to, a red light emitting layer for emitting red light, a green light emitting layer for emitting green light, a blue light emitting layer for emitting blue light, or a yellow light emitting layer for emitting yellow light.

However, the second light emitting layer EML2 may emit light of a color different from that of the first light emitting layer EML1. For example, the first light emitting layer EML1 may be a blue light emitting layer for emitting blue light, and the second light emitting layer EML2 may be a yellow light emitting layer for emitting yellow light. For another example, the first light emitting layer EML1 may be a blue light emitting layer for emitting blue light, and the second light emitting layer EML2 may be a red light emitting layer for emitting red light and a green light emitting layer for emitting green light.

The charge generating layer CGL may be provided in a deposited structure of an N type charge generating layer for providing electrons to the first stack Stack1 and a P type charge generating layer for providing holes to the second stack Stack2.

The second electrode 600 is provided over the light emitting layer 500. In the same manner as the light emitting layer 500, the second electrode 600 is also provided in each of the subpixels P1, P2 and P3 and the boundary area among the subpixels P1, P2, and P3. That is, the second electrode 600 may also be provided above the bank 445.

The second electrode 600 may be formed of a transparent conductive material (TCO) such as ITO and IZO, which can transmit light. The second electrode may be a cathode electrode.

The encapsulation layer 700 is provided over the second electrode 600 to prevent external water from being permeated into the light emitting layer 500. The encapsulation layer 700 may be made of, but not limited to, an inorganic insulating material or a structure in which an inorganic material and an organic material are deposited alternately.

Although not shown in FIG. 3, a capping layer may additionally be provided between the second electrode 600 and the encapsulation layer 700.

The upper conversion layer 800 is provided over the encapsulation layer 700. The upper conversion layer 800 may allow each of the subpixels P1, P2, and P3 to emit only light of a specific wavelength range by absorbing light of a predetermined wavelength range from the light emitted from the light emitting layer 500. The upper conversion layer 800 may be formed of a material known in the art, such as a dye, resin or dielectric, which absorbs light of a specific wavelength range.

The upper conversion layer 800 is formed to be patterned for each of the subpixels P1, P2, and P3. In detail, the upper conversion layer 800 includes a first upper color filter 811 provided to correspond to the first subpixel P1, a second upper color filter 821 provided to correspond to the second subpixel P2, and a third upper color filter 831 provided to correspond to the third subpixel P3.

The first upper color filter 811 passes through light of the red wavelength range from the light emitted from the light emitting layer 500, and absorbs light of the other wavelength ranges, for example, light of the green wavelength range and light of the blue wavelength range. The first upper color filter 811 may include a red dye.

Also, the first upper color filter 811 transmits the incident light of the red wavelength range from the first lower conversion layer 310. Therefore, a transmissive area TA may be provided in the first subpixel P1. A viewer located at the front may view an object or background located at the rear through the first subpixel P1.

The second upper color filter 821 passes through light of the green wavelength range from the light emitted from the light emitting layer 500, and absorbs light of the other wavelength ranges, for example, light of the red wavelength range and light of the blue wavelength range. The second upper color filter 821 may include a green dye. Meanwhile, the second upper color filter 821 absorbs the incident light of the red wavelength range from the second lower conversion layer 320.

The third upper color filter 831 passes through light of the blue wavelength range from the light emitted from the light emitting layer 500, and absorbs light of the other wavelength ranges, for example, light of the red wavelength range and light of the green wavelength range. The third upper color filter 831 may include a blue dye. Meanwhile, the third upper color filter 831 absorbs the incident light of the green wavelength range from the third lower conversion layer 330.

Although FIG. 2 shows that the different lower conversion layers 310, 320, and 330 are respectively provided in the subpixels P1, P2 and P3, the present disclosure is not limited to the example of FIG. 2.

In another embodiment, the lower conversion layer 300, as shown in FIG. 4, may include only the second lower conversion layer 320 comprised of the second lower color conversion layer 322 and the second lower color filter 321.

In detail, the second lower conversion layer 320 is formed to be patterned on a position corresponding to each of the subpixels P1, P2, and P3. Particularly, the second lower conversion layer 320 may be arranged on a light emitting area EA of each of the subpixels P1, P2, and P3.

The second lower color conversion layer 322 may be a downward conversion layer. The downward conversion layer may emit light having low energy by absorbing light having high energy. The second lower color conversion layer 322 absorbs light of a yellow wavelength range or light of a green wavelength range and converts the corresponding light to light of a red wavelength range. The second lower color conversion layer 322 may include red quantum dot particles.

The second lower color filter 321 transmits light of a green wavelength range, and absorbs light of the other wavelength ranges, for example, light of a blue wavelength range and light of a red wavelength range. The second lower color filter 321 may include a green dye.

In each of the subpixels P1, P2, and P3, light emitted from the light emitting layer 500 may progress to the lower portion on which the substrate 110 is arranged. The light progressing to the lower portion is shielded from progressing to the substrate 110 due to the second lower conversion layer 320.

The second lower color conversion layer 322 absorbs light of a yellow wavelength range or light of a green wavelength range from the light emitted from the light emitting layer 500 and converts the corresponding light to light of the red wavelength range. Therefore, the light of the blue wavelength range and the light of the red wavelength range remain as the light which has passed through the second lower color conversion layer 322. At this time, since the light of the green wavelength range is absorbed by the second lower color conversion layer 322, the light of the green wavelength range fails to pass through the second lower color conversion layer 322.

The second lower color filter 321 transmits the light of the green wavelength range from the incident light from the second lower color conversion layer 322, and absorbs light of the other wavelength ranges, for example, light of the blue wavelength range and light of the red wavelength range. Since the light of the blue wavelength range and the light of the red wavelength range only pass through the second lower color conversion layer 322, the second lower color filter 321 fully absorbs the incident light from the second lower color conversion layer 322.

As a result, the light emitted from the light emitting layer 500, progressing to the substrate 110 is fully absorbed by the second lower conversion layer 320.

Meanwhile, the second lower conversion layer 320 partially transmits external light entering toward the substrate 110. In detail, the second lower color filter 321 transmits light of the green wavelength range from the external light entering toward the substrate 110, and absorbs light of the other wavelength ranges, for example, light of the blue wavelength range and light of the red wavelength range. The second lower color conversion layer 322 absorbs the incident light of the green wavelength range from the second lower color filter 321 and converts the corresponding light to light of the red wavelength range. Therefore, only the light of the red wavelength range from the external light may enter the first upper color filter 811, the second upper color filter 821 and the third upper color filter 831.

The first upper color filter 811 transmits the incident light of the red wavelength range from the second lower conversion layer 320. Therefore, a transmissive area TA may be provided in the first subpixel P1. A viewer located at the front may view an object or background located at the rear through the first subpixel P1.

Meanwhile, the second upper color filter 821 and the third upper color filter 831 absorb incident light of a red wavelength range from the second lower conversion layer 320.

In the transparent display device 100 according to another embodiment of the present disclosure, the light emitted from each of the subpixels P1, P2, and P3 does not pass through the substrate 110 due to the second lower conversion layer 320. Therefore, in the transparent display device 100 according to another embodiment of the present invention, a viewer cannot view an image at the rear.

Meanwhile, unlike FIG. 4, in still another embodiment, the lower conversion layer 300 may include only the third lower conversion layer 330 comprised of the third lower color conversion layer 332 and the third lower color filter 331.

In detail, the third lower conversion layer 330 is formed to be patterned on a position corresponding to each of the subpixels P1, P2, and P3. Particularly, the third lower conversion layer 330 may be arranged on a light emitting area EA of each of the subpixels P1, P2 and P3.

The third lower color conversion layer 332 may be a downward conversion layer. The downward conversion layer may emit light having low energy by absorbing light having high energy. The third lower color conversion layer 332 absorbs light of a blue wavelength range and converts the corresponding light to light of a green wavelength range. The third lower color conversion layer 332 may include green quantum dot particles.

The third lower color filter 331 transmits light of a blue wavelength range, and absorbs light of the other wavelength ranges, for example, light of a green wavelength range and light of a red wavelength range. The third lower color filter 331 may include a blue dye.

In each of the subpixels P1, P2, and P3, light emitted from the light emitting layer 500 may progress to the lower portion on which the substrate 110 is arranged. The light progressing to the lower portion is shielded from progressing to the substrate 110 due to the third lower conversion layer 330.

In detail, the third lower color conversion layer 332 absorbs light of a blue wavelength range from the light emitted from the light emitting layer 500 and converts the corresponding light to light of a green wavelength range. Therefore, the light of the green wavelength range and the light of the red wavelength range remain as the light which has passed through the third lower color conversion layer 332. At this time, since the light of the blue wavelength range is absorbed by the third lower color conversion layer 332, the light of the blue wavelength range fails to pass through the third lower color conversion layer 332.

The third lower color filter 331 transmits the light of the blue wavelength range from the incident light from the third lower color conversion layer 332, and absorbs light of the other wavelength ranges, for example, light of the green wavelength range and light of the red wavelength range. Since the light of the green wavelength range and the light of the red wavelength range only pass through the third lower color conversion layer 332, the third lower color filter 331 fully absorbs the incident light from the third lower color conversion layer 332.

As a result, the light emitted from the light emitting layer 500, progressing to the substrate 110 is fully absorbed by the third lower conversion layer 330.

Meanwhile, the third lower conversion layer 330 partially transmits external light entering toward the substrate 110. In detail, the third lower color filter 331 transmits light of the blue wavelength range from the external light entering toward the substrate 110, and absorbs light of the other wavelength ranges, for example, light of the green wavelength range and light of the red wavelength range. The third lower color conversion layer 332 absorbs the incident light of the blue wavelength range from the third lower color filter 331 and converts the corresponding light to light of the green wavelength range. Therefore, only the light of the green wavelength range from the external light may enter the first upper color filter 811, the second upper color filter 821 and the third upper color filter 831.

The second upper color filter 821 transmits the incident light of the green wavelength range from the third lower conversion layer 330. Therefore, a transmissive area TA may be provided in the second subpixel P2. A viewer located at the front may view an object or background located at the rear through the second subpixel P2.

Meanwhile, the first upper color filter 811 and the third upper color filter 831 absorb incident light of a green wavelength range from the third lower conversion layer 330.

In the transparent display device 100 according to still another embodiment of the present invention, the light emitted from each of the subpixels P1, P2, and P3 does not pass through the substrate 110 due to the third lower conversion layer 330. Therefore, in the transparent display device 100 according to still another embodiment of the present invention, a viewer cannot view an image at the rear.

In further still another embodiment, the lower conversion layer 300, as shown in FIG. 5, may include the second lower conversion layer 320 comprised of the second lower color conversion layer 322 and the second lower color filter 321, and the third lower conversion layer 330 comprised of the third lower color conversion layer 332 and the third lower color filter 331.

Any one of the second lower conversion layer 320 and the third lower conversion layer 330 may be provided in each of the subpixels P1, P2 and P3.

In detail, the second lower conversion layer 320 is formed to be patterned on a position corresponding to each of the first subpixel P1 and the second subpixel P2. Particularly, the second lower conversion layer 320 may be arranged on a light emitting area EA of each of the first subpixel P1 and the second subpixel P2.

The second lower color conversion layer 322 may be a downward conversion layer. The downward conversion layer may emit light having low energy by absorbing light having high energy. The second lower color conversion layer 322 absorbs light of a yellow wavelength range or light of a green wavelength range and converts the corresponding light to light of a red wavelength range. The second lower color conversion layer 322 may include red quantum dot particles.

The second lower color filter 321 transmits light of a green wavelength range, and absorbs light of the other wavelength ranges, for example, light of a blue wavelength range and light of a red wavelength range. The second lower color filter 321 may include a green dye.

In each of the first subpixel P1 and the second subpixel P2, light emitted from the light emitting layer 500 may progress to the lower portion on which the substrate 110 is arranged. The light progressing to the lower portion is shielded from progressing to the substrate 110 due to the second lower conversion layer 320.

In detail, the second lower color conversion layer 322 absorbs light of a yellow wavelength range or light of a green wavelength range from the light emitted from the light emitting layer 500 and converts the corresponding light to light of the red wavelength range. Therefore, the light of the blue wavelength range and the light of the red wavelength range remain as the light which has passed through the second lower color conversion layer 322. At this time, since the light of the green wavelength range is absorbed by the second lower color conversion layer 322, the light of the green wavelength range fails to pass through the second lower color conversion layer 322.

The second lower color filter 321 transmits the light of the green wavelength range from the incident light from the second lower color conversion layer 322, and absorbs light of the other wavelength ranges, for example, light of the blue wavelength range and light of the red wavelength range. Since the light of the blue wavelength range and the light of the red wavelength range only pass through the second lower color conversion layer 322, the second lower color filter 321 fully absorbs the incident light from the second lower color conversion layer 322.

As a result, the light emitted from the light emitting layer 500, progressing to the substrate 110 is fully absorbed by the second lower conversion layer 320.

Meanwhile, the second lower conversion layer 320 partially transmits external light entering toward the substrate 110. In detail, the second lower color filter 321 transmits light of the green wavelength range from the external light entering toward the substrate 110, and absorbs light of the other wavelength ranges, for example, light of the blue wavelength range and light of the red wavelength range. The second lower color conversion layer 322 absorbs the incident light of the green wavelength range from the second lower color filter 321 and converts the corresponding light to light of the red wavelength range. The second lower conversion layer 320 may transmit only the light of the red wavelength range from the external light entering toward the substrate 110. Therefore, only the light of the red wavelength range from the external light may enter the first upper color filter 811 and the second upper color filter 821.

The first upper color filter 811 transmits the incident light of the red wavelength range from the second lower conversion layer 320. Therefore, a transmissive area TA may be provided in the first subpixel P1. A viewer located at the front may view an object or background located at the rear through the first subpixel P1. Meanwhile, the second upper color filter 821 absorbs incident light of the red wavelength range from the second lower conversion layer 320.

The third lower conversion layer 330 is formed to be patterned on a position corresponding to the third subpixel P3. Particularly, the third lower conversion layer 330 may be arranged on a light emitting area EA of the third subpixel P3.

The third lower color conversion layer 332 may be a downward conversion layer. The downward conversion layer may emit light having low energy by absorbing light having high energy. The third lower color conversion layer 332 absorbs light of a blue wavelength range and converts the corresponding light to light of a green wavelength range. The third lower color conversion layer 332 may include green quantum dot particles.

The third lower color filter 331 transmits light of a blue wavelength range, and absorbs light of the other wavelength ranges, for example, light of a green wavelength range and light of a red wavelength range. The third lower color filter 331 may include a blue dye.

In the third subpixel P3, light emitted from the light emitting layer 500 may progress to the lower portion on which the substrate 110 is arranged. The light progressing to the lower portion is shielded from progressing to the substrate 110 due to the third lower conversion layer 330.

In detail, the third lower color conversion layer 332 absorbs light of a blue wavelength range from the light emitted from the light emitting layer 500 and converts the corresponding light to light of a green wavelength range. Therefore, the light of the green wavelength range and the light of the red wavelength range remain as the light which has passed through the third lower color conversion layer 332. At this time, since the light of the blue wavelength range is absorbed by the third lower color conversion layer 332, the light of the blue wavelength range fails to pass through the third lower color conversion layer 332.

The third lower color filter 331 transmits the light of the blue wavelength range from the incident light from the third lower color conversion layer 332, and absorbs light of the other wavelength ranges, for example, light of the green wavelength range and light of the red wavelength range. Since the light of the green wavelength range and the light of the red wavelength range only pass through the third lower color conversion layer 332, the third lower color filter 331 fully absorbs the incident light from the third lower color conversion layer 332.

As a result, the light emitted from the light emitting layer 500, progressing to the substrate 110 is fully absorbed by the third lower conversion layer 330.

Meanwhile, the third lower conversion layer 330 partially transmits external light entering toward the substrate 110. In detail, the third lower color filter 331 transmits light of the blue wavelength range from the external light entering toward the substrate 110, and absorbs light of the other wavelength ranges, for example, light of the green wavelength range and light of the red wavelength range. The third lower color conversion layer 332 absorbs the incident light of the blue wavelength range from the third lower color filter 331 and converts the corresponding light to light of the green wavelength range. Therefore, only the light of the green wavelength range from the external light may enter the third upper color filter 831.

The third upper color filter 831 absorbs the incident light of the green wavelength range from the third lower conversion layer 330.

In the transparent display device 100 according to further still another embodiment of the present disclosure, the light emitted from each of the subpixels P1, P2, and P3 does not pass through the substrate 110 due to the second lower conversion layer 320 and the third lower conversion layer 330. Therefore, in the transparent display device 100 according to further still another embodiment of the present disclosure, a viewer cannot view an image at the rear.

Meanwhile, in further still another embodiment, the lower conversion layer 300, as shown in FIG. 6, may include the second lower conversion layer 320 comprised of the second lower color conversion layer 322 and the second lower color filter 321, the third lower conversion layer 330 comprised of the third lower color conversion layer 332 and the third lower color filter 331, and a fourth lower conversion layer 340 comprised of a fourth lower color filter 341.

In detail, the second lower conversion layer 320 is formed to be patterned on a position corresponding to the first subpixel P1. Particularly, the second lower conversion layer 320 may be arranged on a light emitting area EA of the first subpixel P1.

The second lower color conversion layer 322 may be a downward conversion layer. The second lower color conversion layer 322 absorbs light of a yellow wavelength range or light of a green wavelength range and converts the corresponding light to light of a red wavelength range. The second lower color conversion layer 322 may include red quantum dot particles.

The second lower color filter 321 transmits light of a green wavelength range, and absorbs light of the other wavelength ranges, for example, light of a blue wavelength range and light of a red wavelength range. The second lower color filter 321 may include a green dye.

In the first subpixel P1, light emitted from the light emitting layer 500 may progress to the lower portion on which the substrate 110 is arranged. The light progressing to the lower portion is shielded from progressing to the substrate 110 due to the second lower conversion layer 320.

In detail, the second lower color conversion layer 322 absorbs light of a yellow wavelength range or light of a green wavelength range from the light emitted from the light emitting layer 500 and converts the corresponding light to light of the red wavelength range. Therefore, the light of the blue wavelength range and the light of the red wavelength range remain as the light which has passed through the second lower color conversion layer 322. At this time, since the light of the green wavelength range is absorbed by the second lower color conversion layer 322, the light of the green wavelength range fails to pass through the second lower color conversion layer 322.

The second lower color filter 321 transmits the light of the green wavelength range from the incident light from the second lower color conversion layer 322, and absorbs light of the other wavelength ranges, for example, light of the blue wavelength range and light of the red wavelength range. Since the light of the blue wavelength range and the light of the red wavelength range only pass through the second lower color conversion layer 322, the second lower color filter 321 fully absorbs the incident light from the second lower color conversion layer 322.

As a result, the light emitted from the light emitting layer 500, progressing to the substrate 110 is fully absorbed by the second lower conversion layer 320.

Meanwhile, the second lower conversion layer 320 partially transmits external light entering toward the substrate 110. In detail, the second lower color filter 321 transmits light of the green wavelength range from the external light entering toward the substrate 110, and absorbs light of the other wavelength ranges, for example, light of the blue wavelength range and light of the red wavelength range. The second lower color conversion layer 322 absorbs the incident light of the green wavelength range from the second lower color filter 321 and converts the corresponding light to light of the red wavelength range. The second lower conversion layer 320 may transmit only the light of the red wavelength range from the external light entering toward the substrate 110. Therefore, only the light of the red wavelength range from the external light may enter the first upper color filter 811.

The first upper color filter 811 transmits the incident light of the red wavelength range from the second lower conversion layer 320. Therefore, a transmissive area TA may be provided in the first subpixel P1. A viewer located at the front may view an object or background located at the rear through the first subpixel P1.

The third lower conversion layer 330 is formed to be patterned on a position corresponding to the second subpixel P2. Particularly, the third lower conversion layer 330 may be arranged on a light emitting area EA of the second subpixel P2.

The third lower color conversion layer 332 may be a downward conversion layer. The downward conversion layer may emit light having low energy by absorbing light having high energy. The third lower color conversion layer 332 absorbs light of a blue wavelength range and converts the corresponding light to light of a green wavelength range. The third lower color conversion layer 332 may include green quantum dot particles.

The third lower color filter 331 transmits light of a blue wavelength range, and absorbs light of the other wavelength ranges, for example, light of a green wavelength range and light of a red wavelength range. The third lower color filter 331 may include a blue dye.

In the third subpixel P3, light emitted from the light emitting layer 500 may progress to the lower portion on which the substrate 110 is arranged. The light progressing to the lower portion is shielded from progressing to the substrate 110 due to the third lower conversion layer 330.

In detail, the third lower color conversion layer 332 absorbs light of a blue wavelength range from the light emitted from the light emitting layer 500 and converts the corresponding light to light of a green wavelength range. Therefore, the light of the green wavelength range and the light of the red wavelength range remain as the light which has passed through the third lower color conversion layer 332. At this time, since the light of the blue wavelength range is absorbed by the third lower color conversion layer 332, the light of the blue wavelength range fails to pass through the third lower color conversion layer 332.

The third lower color filter 331 transmits the light of the blue wavelength range from the incident light from the third lower color conversion layer 332, and absorbs light of the other wavelength ranges, for example, light of the green wavelength range and light of the red wavelength range. Since the light of the green wavelength range and the light of the red wavelength range only pass through the third lower color conversion layer 332, the third lower color filter 331 fully absorbs the incident light from the third lower color conversion layer 332.

As a result, the light emitted from the light emitting layer 500, progressing to the substrate 110 is fully absorbed by the third lower conversion layer 330.

Meanwhile, the third lower conversion layer 330 partially transmits external light entering toward the substrate 110. In detail, the third lower color filter 331 transmits light of the blue wavelength range from the external light entering toward the substrate 110, and absorbs light of the other wavelength ranges, for example, light of the green wavelength range and light of the red wavelength range. The third lower color conversion layer 332 absorbs the incident light of the blue wavelength range from the third lower color filter 331 and converts the corresponding light to light of the green wavelength range. The third lower conversion layer 330 may transmit only the light of the green wavelength range from the external light entering toward the substrate 110. Therefore, only the light of the green wavelength range from the external light may enter the second upper color filter 821.

The second upper color filter 821 transmits the incident light of the green wavelength range from the third lower conversion layer 330. Therefore, a transmissive area TA may be provided in the second subpixel P2. A viewer located at the front may view an object or background located at the rear through the second subpixel P2.

The fourth lower conversion layer 340 is formed to be patterned on a position corresponding to the third subpixel P3. Particularly, the fourth lower conversion layer 340 may be arranged on a light emitting area EA of the third subpixel P3. The fourth lower color filter 341 transmits light of a blue wavelength range, and absorbs light of the other wavelength ranges, for example, light of a green wavelength range and light of a red wavelength range. The fourth lower color filter 341 may include a blue dye.

In the third subpixel P3, light emitted from the light emitting layer 500 may progress to the lower portion on which the substrate 110 is arranged. The light progressing to the lower portion is partially shielded from progressing to the substrate 110 due to the fourth lower conversion layer 340.

In detail, the fourth lower color filter 341 transmits the light of the blue wavelength range from the incident light from light emitting layer 500, and absorbs light of the other wavelength ranges, for example, light of the green wavelength range and light of the red wavelength range. As a result, only the light of the blue wavelength range in the light emitted from the light emitting layer 500, progressing to the substrate 110 may pass through the substrate 110.

Meanwhile, the fourth lower color filter 341 transmits only the light of the blue wavelength range from the external light entering toward the substrate 110, and absorbs light of the other wavelength ranges, for example, light of the red wavelength range and light of the green wavelength range. Therefore, only the light of the blue wavelength range from the external light may enter the third upper color filter 831.

The third upper color filter 831 transmits the incident light of the blue wavelength range from the fourth lower conversion layer 340. Therefore, a transmissive area TA may be provided in the third subpixel P3. A viewer located at the front may view an object or background located at the rear through the third subpixel P3.

In the transparent display device 100 according to further still another embodiment of the present disclosure, the light emitted from the first subpixel P1 and the second subpixel P2 does not pass through the substrate 110 due to the second lower conversion layer 320 and the third lower conversion layer 330. Also, in the transparent display device 100 according to further still another embodiment of the present disclosure, the light emitted from the third subpixel P3 does not partially pass through the substrate 110. Therefore, in the transparent display device 100 according to further still another embodiment of the present invention, a viewer cannot view a complete image at the rear.

Also, in the transparent display device 100 according to further still another embodiment of the present disclosure, since the transmissive area TA is provided in all of the subpixels P1, P2 and P3, transparency of the device may be improved.

Meanwhile, although FIG. 2 shows that the upper conversion layer 800 does not include a color conversion layer, the upper conversion layer 800 is not limited to the example of FIG. 2.

In another embodiment, the upper conversion layer 800, as shown in FIG. 7, may include a first upper conversion layer 810 comprised of a first upper color conversion layer 812 and a first upper color filter 811, a second upper conversion layer 820 comprise of a second upper color conversion layer 822 and a second upper color filter 821, and a third upper conversion layer 830 comprised of a third upper color conversion layer 832 and a third upper color filter 831.

In detail, the first upper conversion layer 810 may be formed to be patterned on a position corresponding to the first subpixel P1.

The first upper color conversion layer 812 may be a downward conversion layer. The first upper color conversion layer 812 may absorb light of a yellow wavelength range or light of a green wavelength range from light emitted from the light emitting layer 500 and convert the corresponding light to light of a red wavelength range. The first upper color conversion layer 812 may include red quantum dot particles.

The first upper color filter 811 transmits light of the red wavelength range and absorbs light of the other wavelength ranges, for example, light of the blue wavelength range and light of the green wavelength range. The first upper color filter 811 may include a red dye.

In the first subpixel P1, the light emitted from the light emitting layer 500 may progress to the upper portion on which the encapsulation layer 700 is arranged. The first upper color conversion layer 812 absorbs light of the yellow wavelength range or light of the green wavelength range from the light emitted from the light emitting layer 500 and converts the corresponding light to light of the red wavelength range. Therefore, the light of the blue wavelength range and the light of the red wavelength range remain as the light that has passed through the first upper color conversion layer 812.

The first upper color filter 811 transmits the light of the red wavelength range from the incident light from the first upper color conversion layer 812, and absorbs light of the other wavelength ranges, for example, light of the blue wavelength range and light of the green wavelength range. As a result, the first upper color filter 811 transmits only the light of the red wavelength range.

The second upper conversion layer 820 may be formed to be patterned on a position corresponding to the second subpixel P2.

The second upper color conversion layer 822 may be a downward conversion layer. The second upper color conversion layer 822 may absorb light of the blue wavelength range from the light emitted from the light emitting layer 500 and convert the corresponding light to the light of the green wavelength range. The second upper color conversion layer 822 may include green quantum dot particles.

The second upper color filter 821 transmits light of the green wavelength range and absorbs light of the other wavelength ranges, for example, light of the blue wavelength range and light of the red wavelength range. The second upper color filter 821 may include a green dye.

In the second subpixel P2, the light emitted from the light emitting layer 500 may progress to the upper portion on which the encapsulation layer 700 is arranged. The second upper color conversion layer 822 absorbs light of the blue wavelength range from the light emitted from the light emitting layer 500 and converts the corresponding light to light of the green wavelength range. Therefore, the light of the green wavelength range and the light of the red wavelength range remain as the light that has passed through the second upper color conversion layer 822.

The second upper color filter 821 transmits the light of the green wavelength range from the incident light from the second upper color conversion layer 822, and absorbs light of the other wavelength ranges, for example, light of the blue wavelength range and light of the red wavelength range. As a result, the second upper color filter 821 transmits only the light of the green wavelength range.

The third upper conversion layer 830 may be formed to be patterned on a position corresponding to the third subpixel P3.

The third upper color conversion layer 832 may be a downward conversion layer. The third upper color conversion layer 832 may absorb light of a wavelength range shorter than the blue wavelength range from the light emitted from the light emitting layer 500 and convert the corresponding light to the light of the blue wavelength range. The third upper color conversion layer 832 may include blue quantum dot particles.

The third upper color filter 831 transmits light of the blue wavelength range and absorbs light of the other wavelength ranges, for example, light of the green wavelength range and light of the red wavelength range. The third upper color filter 831 may include a blue dye.

In the third subpixel P3, the light emitted from the light emitting layer 500 may progress to the upper portion on which the encapsulation layer 700 is arranged. The third upper color conversion layer 832 absorbs light of the wavelength range shorter than the blue wavelength range from the light emitted from the light emitting layer 500 and converts the corresponding light to light of the blue wavelength range. Therefore, the light of the blue wavelength range, the light of the green wavelength range and the light of the red wavelength range remain as the light that has passed through the third upper color conversion layer 832.

The third upper color filter 831 transmits the light of the blue wavelength range from the incident light from the third upper color conversion layer 832, and absorbs light of the other wavelength ranges, for example, light of the green wavelength range and light of the red wavelength range. As a result, the third upper color filter 831 transmits only the light of the blue wavelength range.

In the transparent display device 100 according to further still another embodiment of the present disclosure, the color conversion layers 812, 822 and 832 may further be provided over the upper conversion layer 800, whereby efficiency of light emitted from each of the subpixels P1, P2, and P3 may be improved.

Meanwhile, although not described in detail, the upper conversion layer 800 shown in FIG. 7 is also applicable to the embodiments shown in FIGS. 4 to 6.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transparent display device comprising:
    a substrate provided with a first subpixel, a second subpixel, and a third subpixel;
    first electrodes provided in each of the first subpixel, the second subpixel, and the third subpixel over the substrate;
    a light emitting layer provided over the first electrodes;
    a second electrode provided over the light emitting layer;
    an upper color filter provided over the second electrode;
    a lower color conversion layer provided between the substrate and the first electrodes and including a first lower color conversion layer, wherein the first lower color conversion layer converts a part of light emitted from the light emitting layer into light of a first wavelength range; and
    a lower color filter provided between the substrate and the lower color conversion layer and including a first lower color filter, wherein the first lower color filter is provided between the substrate and the first lower color conversion layer and absorbs all of light of the first wavelength range incident from the first lower color conversion layer,
    wherein the first subpixel is a blue subpixel, the second subpixel is a green subpixel, and the third subpixel is a red subpixel, and
    wherein the lower color conversion layer is provided in the green subpixel and the blue pixel, and is not provided in the red subpixel.

2. The transparent display device of claim 1, wherein the upper color filter includes a first upper color filter for transmitting light of a red wavelength range and absorbing light of other wavelength ranges except the red wavelength range, a second upper color filter for transmitting light of a green wavelength range and absorbing light of other wavelength ranges except the green wavelength range, and a third upper color filter for transmitting light of a blue wavelength range and absorbing light of other wavelength ranges except the blue wavelength range.

3. The transparent display device of claim 2, wherein the first lower color conversion layer absorbs the light of the blue wavelength range and converts the corresponding light to the light of the green wavelength range, and
    wherein the lower color conversion layer further includes a second lower color conversion layer for absorbing light of a yellow wavelength range or the light of the green wavelength range and converting the corresponding light to the light of the red wavelength range.

4. The transparent display device of claim 3, wherein the first lower color filter transmits the light of the blue wavelength range and absorbing the light of the other wavelength ranges except the blue wavelength range, and
wherein the lower color conversion layer further includes a second lower color filter for transmitting the light of the green wavelength range and absorbing the light of the other wavelength ranges except the green wavelength range, and
wherein the first lower color conversion layer is provided over the first lower color filter, and the second lower color conversion layer is provided over the second lower color filter.

5. The transparent display device of claim 4, wherein the second upper color filter, the first lower color conversion layer, and the first lower color filter are provided in any one of the first subpixel, the second subpixel, and the third subpixel.

6. The transparent display device of claim 4, wherein the first upper color filter, the second lower color conversion layer, and the second lower color filter are provided in any one of the first subpixel, the second subpixel, and the third subpixel.

7. The transparent display device of claim 2, further comprising an upper color conversion layer provided between the second electrode and the upper color filter.

8. The transparent display device of claim 7, wherein the upper color conversion layer includes a first upper color conversion layer for absorbing the light of the blue wavelength range and converting the corresponding light to the light of the green wavelength range, and a second upper color conversion layer for absorbing the light of a yellow wavelength range and converting the corresponding light to the light of the red wavelength range, and
wherein the first upper color conversion layer is provided below the second upper color filter, and the second upper color conversion layer is provided below the first upper color filter.

9. The transparent display device of claim 8, wherein the upper color conversion layer further includes a third upper color conversion layer for absorbing light of a wavelength range shorter than the blue wavelength range and converting the corresponding light to the light of the blue wavelength range, and the third upper color conversion layer is provided below the third upper color filter.

10. The transparent display device of claim 1, wherein the light emitted from the light emitting layer, progressing to the substrate is shielded by the lower color conversion layer and the lower color filter.

11. The transparent display device of claim 1, further comprising a bank that partially exposes each of the first electrodes while overlaying a part of an end of each of the first electrodes.

12. The transparent display device of claim 11, wherein the bank includes a material for absorbing light.

13. A transparent display device, comprising:
a substrate provided with a first subpixel and a second subpixel;
first electrodes provided in each of the first subpixel and the second subpixel over the substrate;
a light emitting layer provided over the first electrodes;
a second electrode provided over the light emitting layer;
an upper conversion layer provided over the second electrode; and
a lower conversion layer provided between the substrate and the first electrodes,
wherein the first electrode and the second electrode are provided to face each other with the light emitting layer therebetween are made of a transparent conductive material,
wherein at least one of the first subpixel and the second subpixel includes a transmissive area in which at least a portion of an external light entering the substrate passes through the lower conversion layer and the upper conversion layer, and
wherein light emitted from the light emitting layer is shielded from progressing to the substrate by the lower conversion layer in at least one of the first subpixel and the second subpixel,
wherein the upper conversion layer transmits light of a first color in the first subpixel, and transmits light of a second color in the second subpixel, and
wherein the lower conversion layer shields all of the light of the first color from progressing to the substrate in the first subpixel, and shields all of the light of the second color from progressing to the substrate in the second subpixel.

14. The transparent display device of claim 13,
wherein the upper conversion layer comprising a first upper color filter for transmitting light of the first color and absorbing light of the other color except the first color in the first subpixel, and a second upper color filter for transmitting light of the second color and absorbing light of the other color except the second color in the second subpixel, and
wherein the lower conversion layer comprising a first lower color conversion layer for absorbing light of the second color and converting light of the second color into light of a wavelength longer than that of light of the second color; and a first lower color filter provided between the substrate and the first lower color conversion layer, for transmitting light of the second color and absorbing light of the other color except the second color.

15. The transparent display device of claim 14, wherein the first lower color conversion layer and the first lower color filter are provided in any one of the first subpixel and the second subpixel, such that the light emitted from the light emitting layer, progressing to the substrate is shielded by the first lower color conversion layer and the first lower color filter.

16. The transparent display device of claim 15, wherein the first lower color conversion layer absorbs light of the second color and converts light of the second color into light of the first color, and
wherein the first lower color conversion layer and the first lower color filter are provided in the first subpixel, such that the first subpixel becomes the transmissive area allowing an external light entering the substrate to pass through.

17. The transparent display device of claim 15, wherein the lower conversion layer further comprises a second lower color filter provided in the first subpixel, for transmitting light of the first color and absorbing light of the other color except the first color, and
wherein the first lower color conversion layer and the first lower color filter are provided in the second subpixel.

18. The transparent display device of claim 16, wherein the lower conversion layer further comprises a second lower color filter provided in the second subpixel, for transmitting light of the second color and absorbing light of the other color except the second color.

19. The transparent display device of claim 13, wherein the upper conversion layer transmits light of a first color in the first subpixel, and transmits light of a second color in the second subpixel, and
wherein the lower conversion layer shields the light of the first color from progressing to the substrate in the first subpixel, and shields the light of the second color from progressing to the substrate in the second subpixel.

* * * * *